United States Patent [19]

Saitoh et al.

[11] Patent Number: 5,016,565
[45] Date of Patent: May 21, 1991

[54] MICROWAVE PLASMA CHEMICAL VAPOR DEPOSITION APPARATUS FOR FORMING FUNCTIONAL DEPOSITED FILM WITH MEANS FOR STABILIZING PLASMA DISCHARGE

[75] Inventors: Keishi Saitoh, Nagahama; Ryuji Okamura, Shiga; Hirokazu Otoshi; Koichi Matsuda, both of Nagahama, all of Japan

[73] Assignee: Canon Kabushiki Kaisha, Tokyo, Japan

[21] Appl. No.: 399,900

[22] Filed: Aug. 29, 1989

[30] Foreign Application Priority Data

Sep. 1, 1988 [JP] Japan .................................. 63-216307
Jun. 19, 1989 [JP] Japan .................................. 1-154743

[51] Int. Cl.⁵ .......................................... C23C 16/50
[52] U.S. Cl. .................................. 118/723; 118/663; 427/39; 427/45.1
[58] Field of Search ................ 118/663, 723; 156/345, 156/643; 427/38, 39, 45.1

[56] References Cited

U.S. PATENT DOCUMENTS

| | | | |
|---|---|---|---|
| 4,619,729 | 10/1986 | Johncock et al. | 156/613 |
| 4,732,761 | 3/1988 | Machida et al. | 427/38 |
| 4,891,118 | 1/1990 | Ooiwa et al. | 156/345 |

FOREIGN PATENT DOCUMENTS 60-186849 9/1985 Japan .
61-283116 12/1986 Japan .
62-33772 2/1987 Japan .

OTHER PUBLICATIONS

S. Kato et al., "High Rate Deposition of a —Si:H Using Electron Cyclotron Resonance Plasma", Journal of Non-Crystalline Solids, 77 and 78, pp. 813–816 (1985).

*Primary Examiner*—Norman Morgenstern
*Assistant Examiner*—Terry J. Owens
*Attorney, Agent, or Firm*—Fitzpatrick, Cella, Harper & Scinto

[57] ABSTRACT

A microwave plasma CVD apparatus for forming a functional deposited film comprises a film-forming chamber having a discharge space, a substrate holder, and apparatus for introducing a film-forming raw material gas into the film-forming chamber, for transmitting microwaves into the film-forming chamber to apply microwave energy to the raw material gas so that the raw material gas is converted into plasma, and for simultaneously applying a bias voltage to the plasma generated in the discharge space from an external system to control the plasma potential. A mechanism is provided for temporarily suspending the application of the bias voltage in the case when abnormal discharge occurs, while monitoring the fluctuation of the bias voltage to be applied to the plasma, to thereby inhibit the occurrence of abnormal discharge.

3 Claims, 7 Drawing Sheets

MICROWAVE PLASMA CHEMICAL VAPOR DEPOSITION APPARATUS FOR FORMING FUNCTIONAL DEPOSITED FILM WITH MEANS FOR STABILIZING PLASMA DISCHARGE

FIELD OF THE INVENTION

The present invention relates to the improvement in a known microwave plasma chemical vapor deposition apparatus (hereinafter referred to as "microwave plasma CVD apparatus") for the formation of a functional deposited film. More particularly, the present invention relates to an improved microwave plasma CVD apparatus with means for controlling plasma potential in the discharge space by application of an external bias voltage, which is suitable for forming a functional deposited film represented by an amorphous silicon-containing deposited film.

BACKGROUND OF THE INVENTION

There have been proposed a number of amorphous semiconductor films (including microcrystal semiconductor films) such as amorphous silicon film containing hydrogen atoms (H) or/and halogen atoms (X)(a-Si(H,X) film), amorphous silicon carbide film containing hydrogen atoms (H) or/and halogen atoms (X)(a-SiC(H,X) film), amorphous silicon nitride film containing hydrogen atoms (H) or/and halogen atoms (X)(a-SiN(H,X) film), amorphous silicon and germanium-containing film which contains hydrogen atoms (H) or/and halogen atoms (X)(a-SiGe(H,X) film) and amorphous germanium film containing hydrogen atoms (H) or/and halogen atoms (X) (a-Ge(H,X) film), which are usable as constituent element members in thin film transistors, electrophotographic photosensitive devices, image input line sensors, image pick-up devices, photovoltaic devices, solar cells, other various electronic devices and other optical devices. Some of these amorphous semiconductor films have been practically used.

For the formation of such deposited film, a radiofrequency glow discharge decomposition method (hereinafter referred to as "RF glow discharge decomposition method") has been generally employed.

However, there are disadvantages for the RF-glow discharge decomposition method such as the: decomposition rate is low; a film-forming raw material gas is likely to be polymerized in the vapor phase thereby causing powdery materials to form which are deposited on the circumferential wall of a deposition chamber; due to high gaseous pressure at the time of forming a deposited film a long period of time is required for the deposition chamber to be ready to continue the film-forming process; the efficiency of a film-forming raw material gas to be consumed for the formation of the deposited film is low, and because of this, the resulting product becomes unavoidably costly.

In order to overcome these disadvantages for the RF-glow discharge decomposition method, the public attention has been recently focused on a microwave plasma CVD method as an effective film-forming method which is free of the foregoing disadvantages which are found on the RF-glow discharge decomposition method. Various studies have been made on the microwave plasma CVD method.

For instance, an ECR microwave plasma CVD method and an apparatus for practicing said method are disclosed in Journal of Non-Crystalline Solids 77 and 78, pp. 813–816(1985) "high rate deposition of a-Si:H using electron cyclotron resonance plasma" by S. KATO and T. AOKI.

Japanese Patent Application Laid-Open Sho.60(1985)-186849 (based on U.S. patent application Ser. No. 580,086, filed Feb. 14, 1985) also discloses a microwave plasma CVD apparatus having an inner chamber circumscribed by a plurality of cylindrical substrates into which microwave energy from microwave introducing means is introduced to improve the utilization efficiency of a film-forming raw material gas.

For these proposed microwave plasma CVD apparatuses, there can be expected certain advantages in the utilization efficiency of a raw material gas and/or deposition rate in the case of forming a deposited film. However, there are still problems for any of these apparatuses. That is, a film is often deposited and adhered onto a microwave introducing window connected to a waveguide or a microwave introducing antenna in the deposition chamber and this causes changes for microwave energy to be introduced thereinto with the progress of time. As a result, it becomes difficult to continuously form a desired deposited film. In order to eliminate these problems, it is required to periodically conduct repairing works on the foregoing microwave introducing means. In consequence, the resulting product becomes unavoidably costly.

Especially, for instance, in the case of preparing an electrophotographic photosensitive member using such conventional microwave CVD apparatus, it takes a long period of time to form its light receiving layer which is required to be as thick as 10 μm or more. The deposition rate is relatively high and during the film-forming process, a substantial quantity of film is also deposited on the microwave introducing means.

Because of this, microwave energy which is introduced through the microwave introducing means into the deposition chamber during the film-forming process is likely to change with the progress of time. As a result, the light receiving layer exhibits such electric characteristics as variance in the layer thickness direction.

Another microwave plasma CVD method and an apparatus suitable for practicing said method, wherein plasma potential is controlled by the application of external bias voltage to form a deposited film, are disclosed in Japanese Patent Application Laid-Open Sho.61(1986)-283116 (based on U.S. patent application Ser. No. 734,576, filed May 15, 1985).

Figure 4:
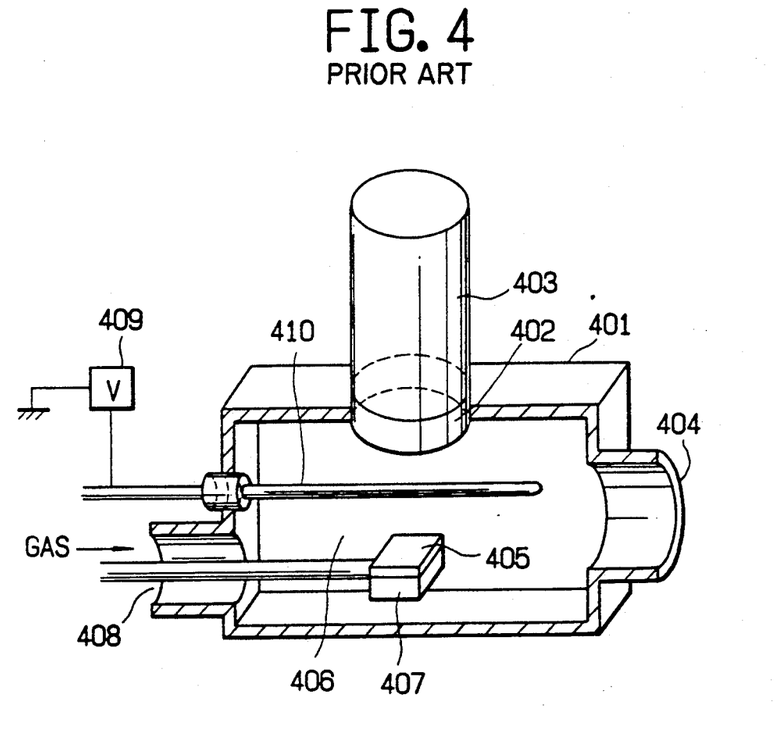
FIG. 4 is a schematic perspective view of a conventional microwave plasma CVD apparatus with means to externally apply a bias voltage.

This microwave plasma CVD apparatus is of such constitution as shown in FIG. 4 (schematic perspective view).

In FIG. 4, numeral reference 401 stands for a substantially enclosed reaction chamber having a discharge space 406, with which a microwave transmissive window 402 made of a dielectric material such as quartz or alumina ceramics is provided. To the microwave transmissive window 402, a waveguide 403 extending from a microwave power source (not shown) is connected. The reaction chamber 401 is provided with an exhaust pipe 404 connected through a main valve (not shown) to an exhaust device (not shown). Numeral reference 407 stands for a holder for a substrate 405 to be positioned thereon, which is installed in the discharge space 406. The substrate holder 407 has an electric heater (not shown) to heat the substrate 405 to a predetermined temperature. The reaction chamber 401 is provided with a gas feed pipe 408 for supplying a raw material gas into the discharge space 406, which is extending from a reservoir (not shown) through mass flow controller (not shown). Numeral reference 410 stands for a bias electrode bar to apply a bias voltage into the discharge space 406, which is electrically connected to a bias power source 409. The formation of a deposited film using this microwave plasma CVD apparatus is carried out, for example, in the following way. That is, firstly, a proper substrate 405 is placed on the substrate holder 407 and the inside of the reaction chamber is evacuated by the action of the exhaust device to thereby bring the discharge space 406 to a vacuum of about $10^{-6}$ Torr Then, the electric heater is actuated to heat the substrate 405 to a predetermined temperature and it is kept at this temperature. Then, a film-forming raw material gas such as silane gas ($SiH_4$) for example in the case of forming an amorphous silicon deposited film is introduced into the discharge space 406 through the gas feed pipe 408. Concurrently, the microwave power source is switched on to generate microwave of frequency in the range of 500 MHz or more (preferably, 2.45 GHz) whereby a microwave energy is introduced through the waveguide 403 and the microwave transmissive window 402 into the discharge space 406. At the same time, the bias power source 409 is switched on to thereby apply a bias voltage of DC, AC or RF into the discharge space 406 through the bias electrode bar 410. Thus, the film-forming raw material gas is excited and diassociated with the action of the microwave energy as applied while the potential of plasma generated being controlled with the action of the bias voltage as applied to cause the formation of a deposited film on the substrate 405.

In this case, it is possible to obtain a practically applicable deposited film of small square with certain expected effects due to the externally applied bias voltage.

However, there are various problems for the foregoing microwave plasma CVD apparatus in the case of forming a thick deposited film of large area for use. For example, in the preparation of an electrophotographic photosensitive device, the formation of the film requires the film-forming process to continue for a long period of time. Other problems are: (i) a film is thickly deposited not only on the microwave introducing means but also on the bias electrode to externally apply a bias voltage and because of this, the quantity of a microwave energy to be applied to plasma generated in the discharge space is unavoidably changed and at the same time, the bias voltage to be externally applied thereto is also unavoidably changed accordingly; (ii) as a result of the above occurrence (i), the resulting film develops characteristics of being undesirably uneven in the thickness direction; (iii) because of the above (i), it sometimes occurs such a happening that plasma becomes unstable causing interruption of discharge; and (iv) it is therefore extremely difficult to stably and repeatedly form a desirable thick deposited film. For the foregoing microwave plasma CVD apparatus, there are further problems in the case of forming a deposited film while continuously applying a bias voltage into the discharge space being maintained at a vacuum of $10^{-2}$ Torr or less for a long period of time that: (v) the quantitative ratios of electrons and ions present in plasma become high causing the plasma to be of extremely low resistance and because of this, there often occurs abnormal discharge such as arc discharge causing interruption of plasma discharge due to excessive electric current by the abnormal discharge; (vi) along with this, electric current excessively flows locally to the substrate and also in the space between the substrate and the bias electrode to result in damaging a film deposited on the substrate and also in removing the film deposited on the bias electrode which eventually contaminates into the film deposited on the substrate; (vii) in addition to the above (vi), electric current excessively flows also in the space between the bias electrode and the gas feed pipe and further in the space between the bias electrode and the microwave introducing means to result in damaging the apparatus; and (viii) this causes problems for the maintenance of the apparatus.

In view of the above, it is extremely difficult to stably mass-produce a desirable deposited film of large area using the forgoing microwave plasma CVD apparatus provided with means to externally apply a bias voltage into the discharge space.

SUMMARY OF THE INVENTION

The present invention is aimed at solving the foregoing problems which are found on the conventional microwave plasma CVD apparatus and providing an improved microwave plasma CVD apparatus which enables one to repeatedly and stably form a desired functional deposited film of large area without occurrence of those problems.

Another object of the present invention is to provide an improved microwave plasma CVD apparatus which enables one to repeatedly and stably form a desired functional deposited film of uniform thickness which has many practical applicable characteristics and which is usable as a constituent element for thin film transistors, electrophotographic photosensitive devices, image input line sensors, image pick-up devices, photovoltaic devices or the like.

A further object of the present invention is to provide an improved microwave plasma CVD apparatus which makes it possible to effectively prevent abnormal discharge such as arc discharge. This makes the resulting deposited film uneven in characteristics and in film thickness and prevents abnormal discharge from occurring in plasma during the firm-forming process, thus making it possible to repeatedly and stably form the above desirable functional deposited film.

According to the present invention, there is provided an improvement in a microwave plasma CVD apparatus for forming a functional deposited film which comprises a film-forming chamber having a discharge space, a substrate holder, means for introducing a film-forming raw material gas into the film-forming chamber and means for transmitting microwave into the film-forming chamber to apply microwave energy to the raw material gas so that the raw material gas is converted into plasma and means for simultaneously applying a bias voltage to the plasma generated in the discharge space from an external system to control the plasma potential, the improvement comprising means for temporarily suspending the application of the bias voltage in the case when abnormal discharge occurs while monitoring the fluctuation of the bias voltage to be applied to the plasma to thereby inhibit the occurrence of abnormal discharge. In the microwave plasma CVD apparatus of the present invention, occurrence of abnormal discharge in the plasma can be predicted in advance from the fluctuation of a bias voltage to be applied to the plasma and when an abrupt lowering is recognized for the bias voltage, the application of an electric current to a bias electrode is temporarily suspended to thereby prevent abnormal discharge from occurring during the film-forming process. Now, by abrupt lowering of the bias voltage is meant that the plasma becomes into a state of low resistance which causes the abnormal discharge.

BRIEF DESCRIPTION OF THE DRAWINGS

FIGS. 5(A) and 5(B) are graphs respectively showing progressive changes of an electric voltage and an electric current between a bias probe and a substrate during the formation of a photoconductive layer with the passage of time, wherein FIG. 5(A) is in the case of the microwave plasma CVD apparatus according to the present invention, while FIG. 5(B) is in the case of the microwave plasma CVD apparatus which does not have a spark killer.

DETAILED DESCRIPTION OF THE PREFERRED EMBODIMENTS

Representative embodiments of the improved microwave plasma CVD apparatus for forming a functional deposited film according to the present invention will now be explained in detail with reference to the drawings. The description is not intended to limit the scope of the present invention.

Figure 1A:
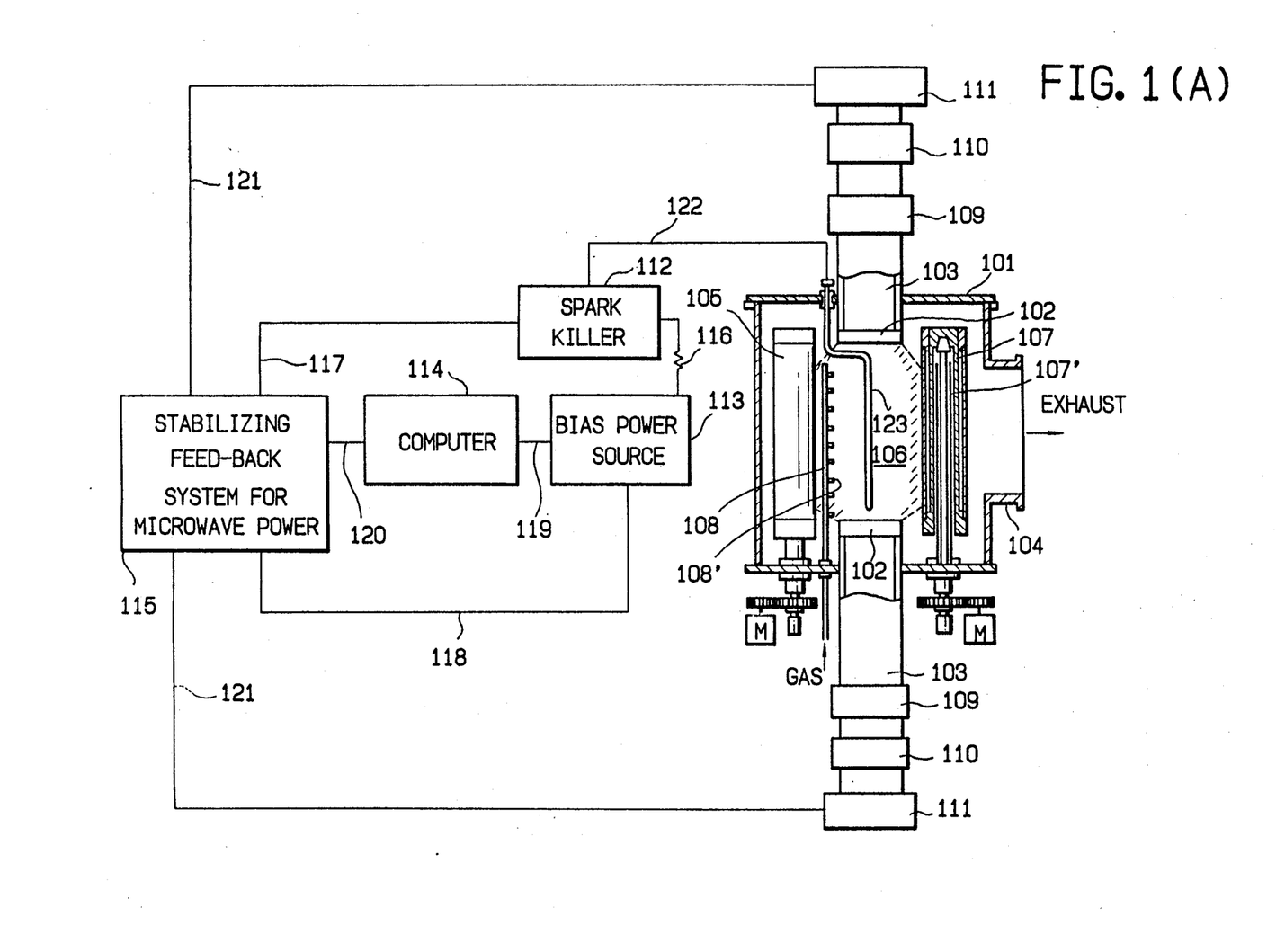
FIG. 1(A) is a vertical sectional view of a microwave plasma CVD apparatus as a preferred embodiment of the present invention.
Figure 1B:
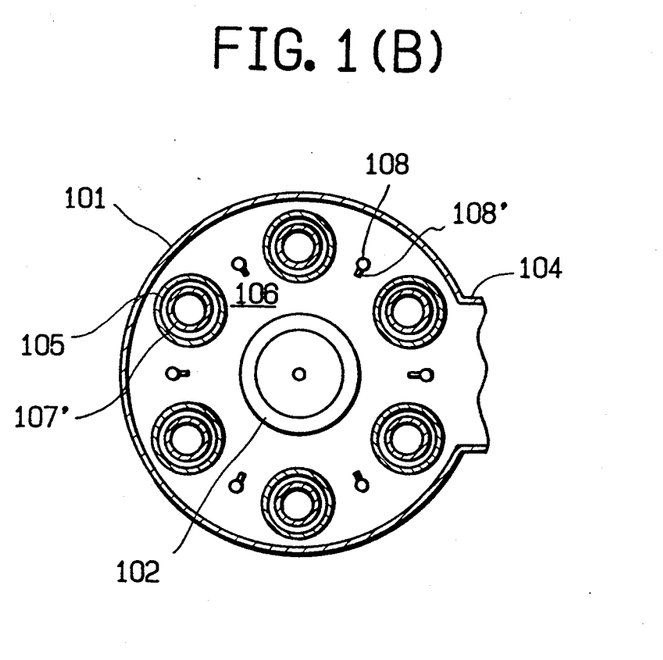
FIG. 1(B) is a horizontal sectional view of the microwave plasma CVD apparatus shown in FIG. 1(A).

There is shown a typical example of the microwave plasma CVD apparatus according to the present invention in FIGS. 1(A) and 1(B). The apparatus shown in FIGS. 1(A) and 1(B) comprises a substantially enclosed cylindrical film-forming chamber 101 comprising a circumferential wall having an end portion thereof hermetically provided with a microwave introducing window 102 made of a microwave transmissive dielectric material to which a waveguide 103 made of a metallic material extending from a microwave power source 111 through an isolator (not shown), a microwave wattmeter 110 and a matching box 109 with automatic mechanism (not shown) is connected.

The film-forming chamber 101 has a discharge space 106 and a plurality of rotatable cylindrical substrate holders 107 therein. Each of the substrate holders 107 is capable of holding a cylindrical substrate 105 positioned thereon and has a electric heater 107' installed therein to heat the substrate 105. Said plurality of rotatable cylindrical substrate holders 107 are concentrically arranged in the film-forming chamber 101 so as to circumscribe the discharge space 106. Numeral reference 108 stands for a gas feed pipe made of a dielectric material which is extending from a reservoir (not shown) through mass flow controller (not shown) and which serves to supply a film-forming raw material gas which is longitudinally installed in the discharge space 106. The feed pipe 108 is provided with a plurality of gas liberation holes (such as nozzles) 108 capable of evenly liberating a film-forming raw material gas into the discharge space 106. In a preferred embodiment, a feed pipe 108 having a plurality of gas liberation holes is provided in every space between every two rotatable cylindrical substrate holders 107 so that the discharge space 106 is circumscribed by a plurality of rotatable cylindrical substrate holders 107 and feed pipes 108. Numeral reference 104 is an exhaust pipe provided with the film-forming chamber 101 which serves to evacuate said chamber. The exhaust pipe 104 is connected through a main valve (not shown) to an exhaust device (diffusion pump, etc.) (not shown). Numeral reference 123 stands for a bias electrode through which a bias voltage of DC, AC or RF is applied to plasma generated in the discharge space 106 in order to control the plasma potential. The bias electrode 123 is longitudinally suspended in the discharge space 106 and it is electrically connected to a bias power source of DC, AC or RF 113. Numeral reference 112 is a mechanism (hereinafter referred to as "spark killer") for temporarily suspending the application of a bias voltage when abnormal discharge is occurred or is to be occurred. In the periphery of the spark killer 112 and the bias power source 113, there is provided a mechanism for attaining the purpose of the present invention which comprises a computer 114: a microwave power stabilizing feedback unit 115: a stabilizing resistor 116: a cable 117 for feeding a dummy signal from the spark killer 112 to the microwave power stabilizing feedback unit 115: a cable 122 for applying a bias voltage to the bias electrode 123 through the spark killer 112: a bias current detecting cable 119 for feeding a signal from the bias power source 113 to the microwave power stabilizing feedback unit 115: a cable 120 for feeding a signal to control the microwave power stabilizing feedback unit 115 by the computer 114: and a cable 121 for feeding a signal from the microwave power stabilizing feedback unit 115 to control the microwave power source 111.

The cylindrical film-forming chamber 101 may be made of stainless steel. In a most preferred embodiment, the cylindrical film-forming chamber 101 is desired to be made of aluminum in view of the case where etching is practiced and also in view of the case where corrosive gas is used.

The microwave introducing window 102 may be made of a dielectric material having a large microwave transmittance such as alumina ceramics, quartz, boron nitride (BN), beryllia or silicon nitride (SiN). In a most preferred embodiment, the microwave introducing window 102 is desired to be made of alumina ceramics which is highly resistant against changes in the temperature in addition to having a large microwave transmittance.

As for the bias electrode 123, it may be made of stainless steel, copper, wolfram, molybdenum or nickel. In a most preferred embodiment, the bias electrode 123 is desired to be made of nickel since there is a slight occasion for undesired impurities to be contaminated into the resulting deposited film in this case.

As the bias power source 113, there can be used a DC power source, a AC power source or a RF power source. In a preferred embodiment in this respect, it is desired to use the DC power source. In a most preferred embodiment, a stabilized DC power source is desired.

To externally apply a bias voltage to the bias electrode 123 it is desired that it be practiced under the condition that the foregoing cylindrical substrates 105 are made electrically negative and the bias electrode 123 is made electrically positive. In this case, positive ions in plasmas generated in the discharge space 106 are effectively collided against the cylindrical substrates 105 to thereby bring about significant improvements on a film to be deposited on each of the cylindrical substrates 105 especially in terms of film quality.

Figure 2:
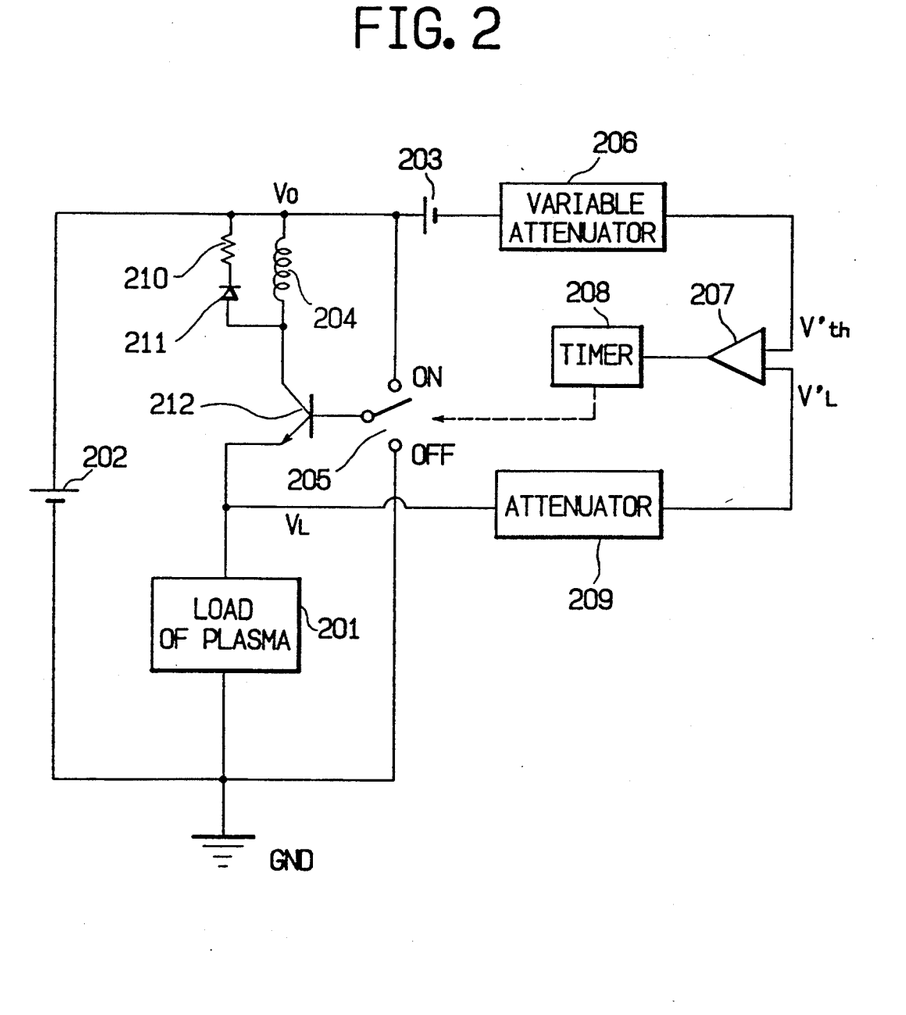
FIG. 2 is a block diagram of a fundamental spark killer circuit to be disposed in the microwave plasma CVD apparatus shown in FIGS. 1(A) and 1(B).

The foregoing spark killer 112 in the microwave plasma CVD apparatus of the present invention is constituted by an appropriate circuit such that the purpose of the spark killer 112 is effectively attained. In FIG. 2, there is shown a representative fundamental circuit for the spark killer 112. The circuit shown in FIG. 2 comprises a load of plasma 201, specifically a resistor for detecting a load of plasma (the resistance between the bias electrode 113 and the cylindrical substrate 105); a bias power source 202 [the bias power source 113 in FIG. 1(A)]; an offset power source 203; a choking coil 204; a switch 205 for turning on or off the bias power source 202: attenuators 206, 209: a comparator 207: a timer 208 for setting a period of time to return the bias power source 202 from an OFF state to an ON state: resistor 210: a diode 211: and a transistor 212.

The fundamental motion of the spark killer 112 thus constituted is to conduct ON/OFF turning while locating the transistor 212 in series between the load of plasma 201 (i.e. the resistor of detecting the resistance between the bias electrode and the cylindrical substrate) and the bias power source 202.

The transistor 212 has a property that a resistance between a collector and an emitter is changed in response to a voltage applied to a base. When the switch 205 is turned off, the base is at GND level and the resistance between the collector and the emitter is $\infty(\Omega)$, so that a bias current is not applied to the load of plasma 201. On the contrary, when the switch 205 is turned on, the bias voltage is applied, the resistance between the collector and the emitter comes nearly $0(\Omega)$, the bias voltage is applied to the load of plasma 201, and electricity flows. This switching operation is performed by the right-half unit in FIG. 2.

The attenuator 209, which is to reduce a voltage to a 1/20, reduces a voltage $V_L$ applied to the load of plasma 201 to a 1/20 on the basis of GND level, and inputs the voltage to the comparator 207. On the other hand, the variable attenuator 206 reduces a voltage $V_o$ of the bias power source 202 to a level of 0 to 1/20 and inputs the reduced voltage to the comparator 207. This reduced voltage is used as a threshold Vth'. The threshold Vth' may be properly determined by changing a damped ratio of the attenuator 206.

The comparator 207 compares a 1/20 of the voltage of the load of plasma 201 with the threshold Vth', i.e. a x/20 of the voltage of the power source. When the load voltage falls below the threshold, the switch 205 is turned off. In actuality, a period of time for returning from the OFF state to the ON state is controlled, since the timer (logic unit) 208 is disposed between the comparator 207 and the switch 205.

The choking coil 204 disposed in a loop comprising the bias power source 202 and the load of plasma 201 retards the change of an electric current against the abrupt change of voltage. The resistor 210 and the diode 211 act for forming a bypass to release counter electromotive force generated in the choking coil 204, when the circuit is turned off. The threshold Vth is preferably determined as near $V_L$ as possible, to perform accurate control.

Accordingly, the operation afore-mentioned is repeated in the spark killer circuit at every moment when abnormal discharge is formed in plasma, so as to intercept the application of a bias current and to reapply the bias current.

The present inventors have experimentally confirmed that the microwave plasma CVD apparatus characterized by having the foregoing spark killer according to the present invention provides various advantages which cannot be easily expected from the prior art: various semiconductor films having an uniform thickness and exhibiting uniform electric characteristics can be stably and repeatedly formed since microwave plasma generated in the discharge space is always maintained stable during film-formation without occurrence of abnormal discharge; even in the case of continuously forming deposited films for a long period of time, those deposited films obtained are uniform not only in the film quality but also in the electric characteristics; there is no occasion for the apparatus to be damaged by abnormal discharge even when continuously used for a long period of time; the apparatus can be maintained with low expenses; and because of this, it is possible to provide a high quality deposited film product at a reduced cost.

Now, in the following, a typical example of the film-forming process using the foregoing microwave plasma CVD apparatus according to the present invention will be explained.

Firstly, a cylindrical aluminum substrate 105 is positioned on each of the six cylindrical substrate holders 105 in the film-forming chamber 101. Then, all the cylindrical substrate holders 107 are rotated by revolving the motor. Thereafter, the inside of the film-forming chamber is evacuated by the action of the exhaust device (diffusion pump) to thereby bring the discharge space 106 to a vacuum of about $10^{-6}$ Torr Then, the electric heater 107' is actuated to heat each cylindrical substrate 105 to a temperature in the range of 50° to 400° C. and all the cylindrical substrates 105 are kept at this temperature.

Successively, a film-forming raw material gas is supplied into the discharge space 106 at a predetermined flow rate through each of the feed pipes 108. After the flow rate of the film-forming raw material gas becomes stable, the inner pressure of the discharge space 106 is adjusted to a vacuum in the range of $1\times10^{-2}$ to $1\times10^{-4}$ Torr by regulating the main valve of the exhaust pipe 104. Then, a command signal to introduce a microwave energy of predetermined power into the discharge space 106 of the film-forming chamber 101 is given through the microwave power stabilizing feedback unit 115 to the microwave power source 111 by the computer 114 in which a predetermined program is preparedly stored. At the same time, a signal to apply a predetermined DC voltage to the bias electrode 123 is given from the computer 114 to the bias power source 113.

In this way, plasma is generated in the discharge space 106 circumscribed by the six cylindrical substrates 105 being rotating to cause the formation of a deposited film on each of the cylindrical substrates 105.

The microwave power during the formation of the deposited film is controlled in a manner such that electricity in constant quantity flows from the bias power source 113 to the bias electrode 123. For this purpose, an electric signal fed from the bias power source 113 is transmitted through the bias current detecting cable 118 to the microwave power stabilizing feedback unit 115, to control output power of the microwave power source 111. At this step, a bias voltage applied from the bias electrode 123 to the plasma generated in the discharge space 106 is monitored by the spark killer 112.

In case when abnormal discharge is formed during this period, the plasma is changed into a state of extremely low resistivity, so that the bias voltage applied to the plasma is rapidly lowered. The spark killer 112 detects this lowering of the bias voltage, and intercepts electric connection between the bias electrode 123 and the bias power source 113. During this period, a dummy signal for stabilizing the microwave power is supplied through the cable 117 to the microwave power stabilizing feedback unit 115.

Consequently, the foregoing interception and returning of the bias voltage are repeated at every moment when the abnormal discharge is formed in the plasma, without exerting negative influence on the microwave power. Thus, the plasma is continuously held under a stabilized condition. Because of this, a desired deposited film of high quality is formed on each of the cylindrical substrates 105.

The effects of the present invention can be confirmed by the results of the following film-forming examples.

EXAMPLE 1 AND COMPARATIVE EXAMPLE 1

EXAMPLE 1

Using the microwave plasms CVD apparatus shown in FIGS. 1(A), 1(B) and 2, there were prepared six electrophotographic photosensitive members, each comprising a substrate and a light receiving layer being disposed on said substrate, said light receiving layer comprising a charge injection inhibition layer, a photoconductive layer and a surface protective layer being laminated in this order from the side of the substrate.

As the substrate, there was used a cylindrical aluminum substrate of 108 mm in outer diameter, 358 mm in length and 5 mm in thickness.

On each of the cylindrical substrate holders 107, there was positioned said cylindrical aluminum substrate. All the cylindrical substrate holders 107 were made to rotate by revolving the motor. Thereafter, the inside of the film-forming chamber was evacuated by the action of the exhaust device (diffusion pump) to thereby bring the discharge space 106 to a vacuum of about $10^{-6}$ Torr. The electric heater 107' was actuated to heat each cylindrical substrate 105° to 250° C. and all the cylindrical substrates 105 were kept at this temperature.

Successively, the film-forming raw material gases for the formation of the charge injection inhibition layer shown in Table 1 were supplied into the discharge space 106 at the respective flow rates shown in Table 1 through each of the feed pipes 108. After the flow rates of all the film-forming raw material gases became stable, the inner pressure of the discharge space 106 was adjusted to a vacuum of 0.4 mTorr by regulating the main valve of the exhaust pipe 104. Then, a command signal to introduce a microwave energy of 2 KW into the discharge space 106 of the film-forming chamber 101 was given through the microwave power stabilizing feedback unit 115 to the microwave power source 111 by the computer 114 in which a predetermined program is preparedly stored. At the same time, a signal to apply a DC voltage of 100 V/(9±0.05) A to the bias electrode 123 was given from the computer 114 to the bias power source 113.

In this way, plasma was generated in the discharge space 106 circumscribed by the six cylindrical substrates 105 being rotated to cause the formation of a deposited film comprised of a-Si:H:O:B to be the charge injection inhibition layer on each of the cylindrical substrates 105.

The foregoing conditions for the formation of the charge injection inhibition layer are shown in Table 1.

Then, there was formed the photoconductive layer comprised of a-Si:H on the charge injection inhibition layer by repeating the above procedures except that the film-forming conditions were changed as shown in the column "photoconductive layer" of Table 1.

Successively there was formed the surface protective layer comprised of a-SiC:H on the photoconductive layer by repeating the foregoing procedures for the formation of the charge injection inhibition layer except that the film-forming conditions were changed as shown in the column "surface protective layer" of Table 1.

COMPARATIVE EXAMPLE 1

Figure 3:
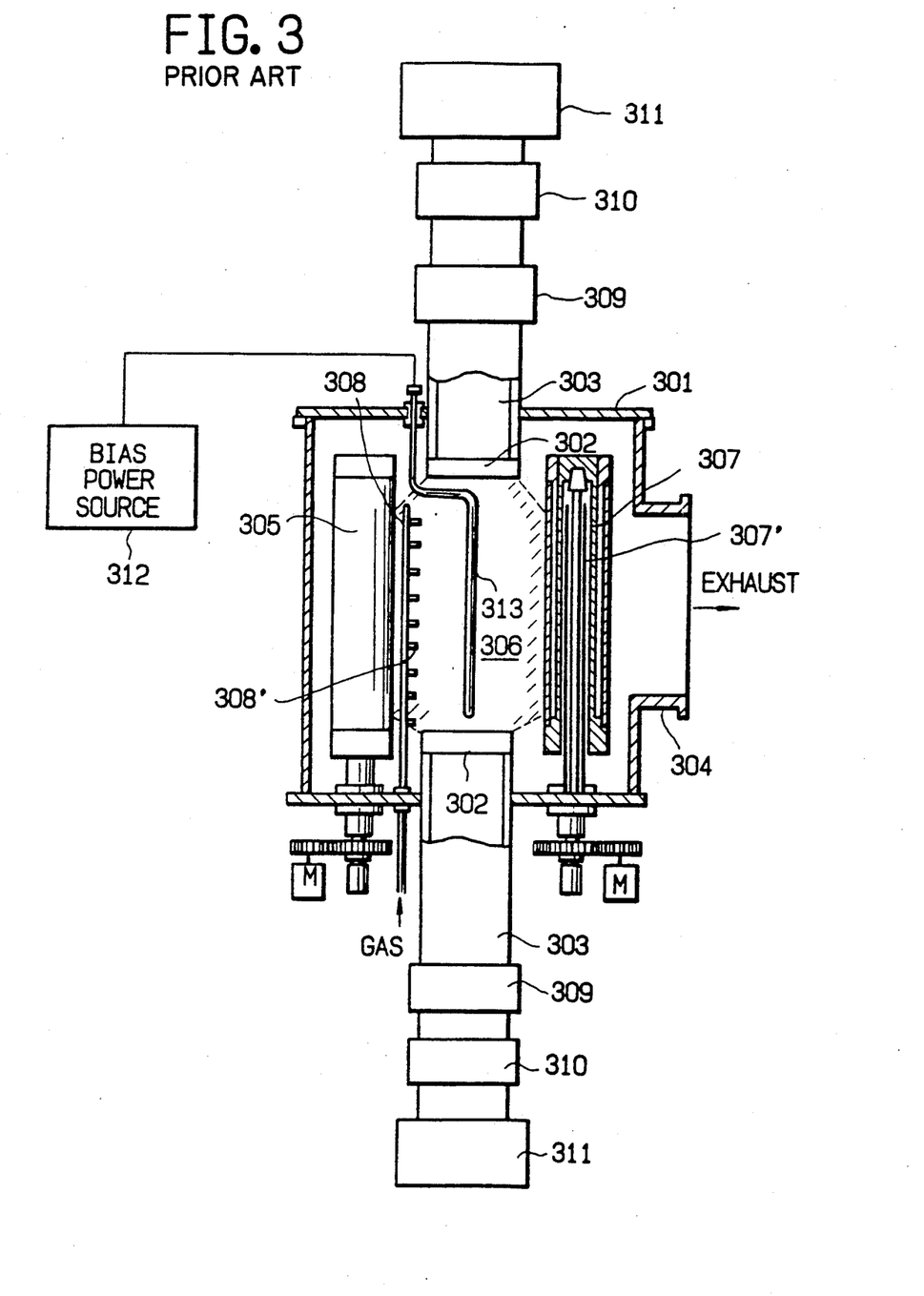
FIG. 3 is a vertical sectional view of a comparative microwave plasma CVD apparatus used in the later described Comparative Examples.

In this comparative example, there was used the microwave plasma CVD apparatus shown in FIG. 3 which does not have any such feedback mechanism to control the bias power source as in the case of the microwave plasma CVD apparatus shown in FIGS. 1(A), 1(B) and 2 according to the present invention and which has the same constitution as that of said apparatus according to the present invention from which the feedback mechanism is omitted.

As well as in Example 1, there were prepared six electrophotographic photosensitive members, each of which comprising a substrate and a light receiving layer being disposed on said substrate said light receiving layer comprising a charge injection inhibition layer, a photoconductive layer and a surface protective layer being laminated in this order from the side of the substrate.

As the substrate, there was used a cylindrical aluminum substrate of 108 mm in outer diameter, 358 mm in length and 5 mm in thickness.

On each of the cylindrical substrate holders 307, there was positioned said cylindrical aluminum substrate. All the cylindrical substrate holders 307 were made rotating by revolving the motor. Thereafter, the inside of the film-forming chamber 301 was evacuated by the action of the exhaust device (diffusion pump) (not shown) to thereby bring the discharge space 306 to a vacuum of about $10^{-6}$ Torr. The electric heater 307' was actuated to heat each cylindrical substrate 305° to 250° C. and all the cylindrical substrates 305 were kept at this temperature.

Successively, the film-forming raw material gases for the formation of the charge injection inhibition layer shown in Table 1 were supplied into the discharge space 306 at the respective flow rates shown in Table 1 through each of the feed pipes 308. After the flow rates of all the film-forming raw material gases became stable, the inner pressure of the discharge space 306 was adjusted to a vacuum of 0.4 mTorr by regulating the main valve (not shown) of the exhaust pipe 304. Then, a microwave energy of 2 KW was supplied into the discharge space 306 of the film-forming chamber 301. At the same time, a DC voltage of 100 V/(9±0.05) A was applied to the bias electrode 313 from the bias power source 312.

In this way, plasma was generated in the discharge space 306 circumscribed by the six cylindrical substrates 305 being rotated to cause the formation of a deposited film comprised of a-Si:H:O:B to be the charge injection inhibition layer on each of the cylindrical substrates 305.

Then, there was formed the photoconductive layer comprised of a-Si:H on the charge injection inhibition layer by repeating the above procedures except that the film-forming conditions were changed as shown in the column "photoconductive layer" of Table 1.

Successively there was formed the surface protective layer comprised of a-SiC:H on the photoconductive layer by repeating the foregoing procedures for the formation of the charge injection inhibition layer except that the film-forming conditions were changed as shown in the column "surface protective layer" of Table 1.

Evaluations

In each case of Example 1 and Comparative Example 1, there were observed the situations of changes for the electric voltage applied to plasma generated in the discharge space and the electric current in the plasma during the formation of the photoconductive layer by means of a conventional method.

Figure 5A:
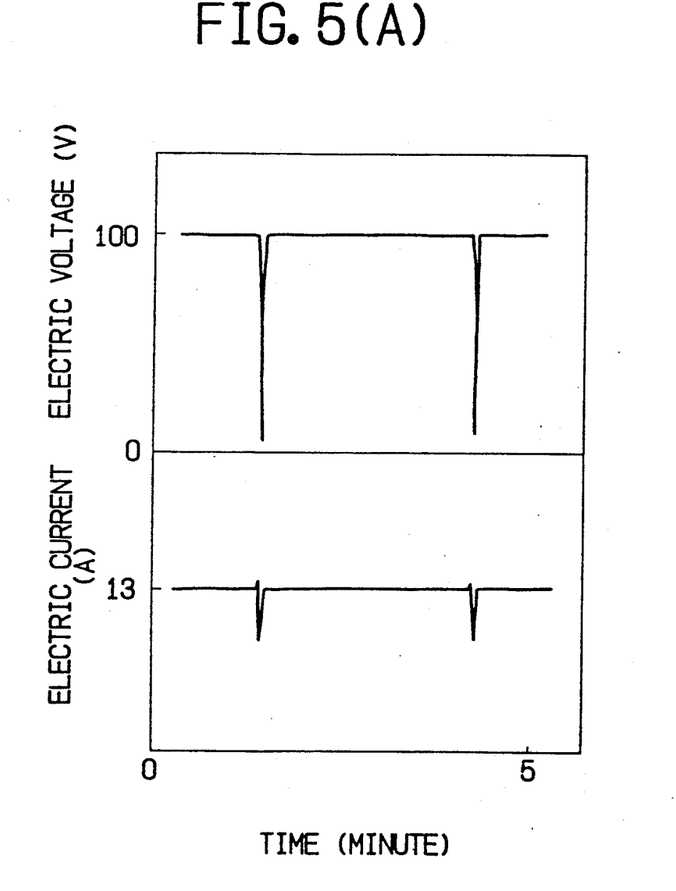

The observed results obtained in Example 1 were as shown in FIG. 5(A). The observed results obtained in Comparative Example 1 were as shown in FIG. 5(B).

As FIG. 5(A) illustrates, it is understood that the electric current in the plasma generated in the discharge space 106 is always maintained in a stable state without occurrence of any negative change thereon in the case of Example 1.

Figure 5B:
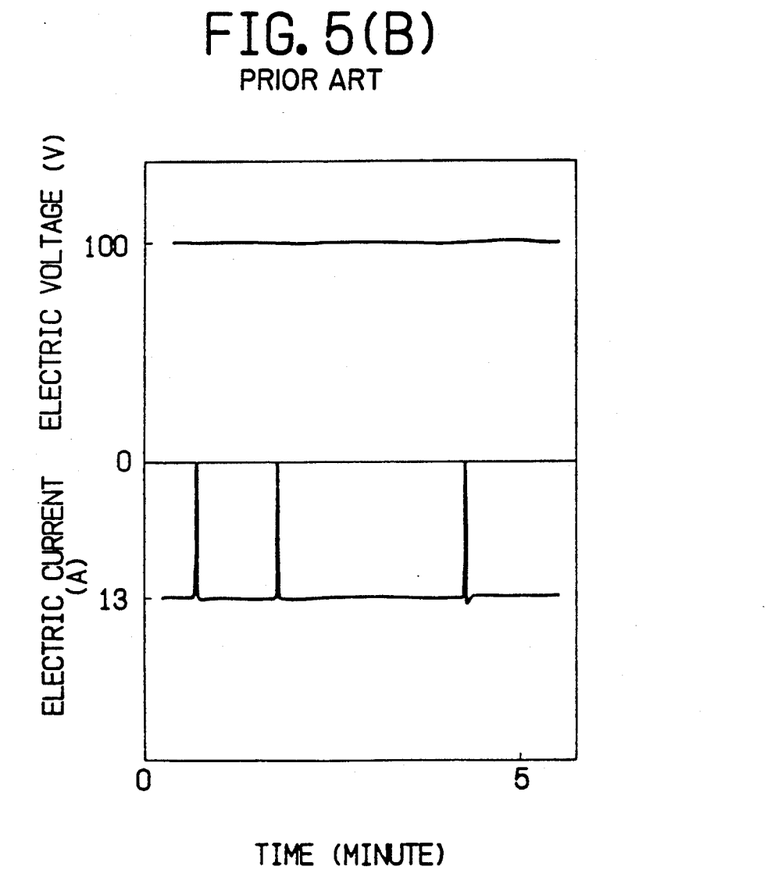

On the other hand, as FIG. 5(B) illustrates, it is understood that there is frequently observed an abnormal change in the electric current in the plasma generated in the discharge space 306 due to occurrence of spark therein in Comparative Example 1.

Thus, it is understood that the microwave plasma CVD apparatus having the constitution shown in FIGS. 1(A), 1(B) and 2 according to the present invention is effective in maintaining plasma discharge in an extremely stable state during film-formation, as compared with the comparative microwave plasma CVD apparatus shown in FIG. 3.

Other than the above, each of the resultant electrophotographic photosensitive members obtained in Example 1 and Comparative Example 1 was set to a commercially available Canon's Electrophotographic Copying Machine NP-7550 (product of CANON KABUSHIKI KAISHA) to examine the quality of an image reproduced.

As a result, as for each of the resultant electrophotographic photosensitive members obtained in Example 1, it has been found that there can be stably obtained a high quality image without accompaniment of any defect. On the other hand, in the case of the resultant electrophotographic photosensitive members obtained in Comparative Example 1, it has been found that any of them often provide such image as accompanied with defects in gathered states.

Consequently, it has been confirmed that the microwave plasma CVD apparatus according to the present invention makes it possible to stably produce a desirable electrophotographic photosensitive member which always provides a desirable high quality image.

EXAMPLE 2 AND COMPARATIVE EXAMPLE 2

EXAMPLE 2

The procedures for preparing the electrophotographic photosensitive members of Example 1 were repeated, to thereby obtain 18 electrophotographic photosensitive members each of which having the same layer constitution as in Example 1.

COMPARATIVE EXAMPLE 2

The procedures for preparing the electrophotographic photosensitive members of Comparative Example 1 were repeated, to thereby obtain 18 electrophotographic photosensitive members, each of which having the same layer constitution as in Comparative Example 1.

Evaluations

For each of the resultant electrophotographic photosensitive members obtained in Example 2 and Comparative Example 2, there were evaluated the quality and ghost appearance on an image reproduced, charge retentivity sensitivity and other electrophotographic characteristics in accordance with conventional methods.

As a result, as for the 18 electrophotographic photosensitive members obtained in Example 2, it has been found that any of them stably and repeatedly provides a high quality image with no ghost appearance and without accompaniment of any defect and excels in the charge retentivity, sensitivity and other electrophotographic characteristics. Further, for any of them, there has not been observed any undesirable local unevenness in the electrophotographic characteristics.

As for the remaining 18 electrophotographic photosensitive members obtained in Comparative Example 2, it has been found that they often provide defective images, and the state of a defect on an image reproduced is significantly different among them.

Further, for any of them, there has been observed undesirable local unevenness in the electrophotographic characteristics.

Consequently, it has been confirmed that the microwave plasma CVD apparatus according to the present invention is suitable for mass-producing desirable electrophotographic photosensitive members.

TABLE 1

| film-forming conditions | constituent layer | | |
|---|---|---|---|
| | charge injection inhibition layer | photoconductive layer | surface protective layer |
| gas used and its flow rate | $SiH_4$: 500 sccm<br>$H_2$: 500 sccm<br>$B_2H_6$: 2000 ppm<br>NO: 40 sccm | $SiH_4$: 500 sccm<br>$H_2$: 500 sccm | $SiH_4$: 200 sccm<br>$CH_4$: 1000 sccm |
| deposition period | 10 min. | 67 min. | 5 min. |
| inner pressure | 0.4 mTorr | 0.4 mTorr | 0.4 mTorr |
| substrate temperature | 250° C. | 250° C. | 250° C. |
| externally applied bias voltage | 100V/(9 ± 0.05)A | 100V/(13 ± 0.05)A | 15V/(1 ± 0.05)A |
| microwave power | 2 KW | 2 KW | 2 KW |

TABLE 1-continued

| film-forming conditions | constituent layer | | |
|---|---|---|---|
| | charge injection inhibition layer | photoconductive layer | surface protective layer |
| layer thickness | 3 μm | 20 μm | 0.5 μm |

We claim:

1. In a microwave plasma CVD apparatus for forming a functional deposited film which comprises a film-forming chamber having a discharge space, a substrate holder for a substrate to be positioned thereon, within said discharge space, means for introducing a film-forming raw material gas into the film-forming chamber, means, including a microwave power source, for transmitting microwaves into the flim-forming chamber to apply microwave energy to the raw material gas so that the raw material gas is converted into plasma, and means, including a bias electrode positioned in said film-forming chamber and a bias power source, for simultaneously applying a bias voltage to the plasma generated in the discharge space to control the plasma potential, the improvement comprising:

means for monitoring fluctuation of the bias voltage applied to the plasma, and means for temporarily suspending the application of the bias voltage to the plasma in response to said monitoring means to prevent the occurrence of abnormal discharge.

2. The apparatus according to claim 1, wherein said means for temporarily suspending the application of the bias voltage comprises a spark killer.

3. The apparatus according to claim 2, wherein said spark killer includes a mechanism comprising:

a computer; a microwave power stabilizing feedback unit; a stabilizing resistor connected between said bias power source and said spark killer; a cable for feeding a dummy signal from the spark killer to the microwave power stabilizing feedback unit; a cable from said bias power source for applying a bias voltage to said bias electrode through the spark killer; a bias current detecting cable for feeding a signal from the bias power source to the microwave power stabilizing feedback unit; a cable for feeding a signal to control the microwave power stabilizing feedback unit by the computer; and a cable for feeding a signal from the microwave power stabilizer feedback unit to control said microwave power source.

* * * * *

UNITED STATES PATENT AND TRADEMARK OFFICE
CERTIFICATE OF CORRECTION

PATENT NO. : 5,016,565

DATED : May 21, 1991

INVENTOR(S) : KEISHI SAITOH, ET AL.

Page 1 of 3

It is certified that error appears in the above-identified patent and that said Letters Patent is hereby corrected as shown below:

COLUMN 1

Line 40, "radiofre-" should read --radio-fre- --.
    Line 42, "RF glow" should read --RF-glow--.
    Line 45, "as the:" should read --as: the--.

COLUMN 2

Line 14, "casc" should read --case--.

COLUMN 3

Line 12, "$10^{-6}$Torr" should read --$10^{-6}$Torr.--.
    Line 28, "diassociated" should read --disassociated--.
    Line 30, "as" should read --is--.
    Line 53, "such a happening" should be deleted.

COLUMN 4

Line 41, "firm-forming" should read --film-forming--.

COLUMN 5

Line 2, "becomes into" should read --acquires--.

UNITED STATES PATENT AND TRADEMARK OFFICE
CERTIFICATE OF CORRECTION

PATENT NO. : 5,016,565

DATED : May 21, 1991

INVENTOR(S) : KEISHI SAITOH, ET AL.

It is certified that error appears in the above-identified patent and that said Letters Patent is hereby corrected as shown below:

COLUMN 7

Line 64, "Vth" should read --Vth'--.

COLUMN 8

Line 21, "expenses;" should read --expense;--.
    Line 29, "105" should read --107--.
    Line 34, "$10^{-6}$ Torr" should read --$10^{-6}$ Torr.--.

COLUMN 9

Line 26, "plasms" should read --plasma--.
    Line 45, "substrate 105°" should read --substrate 105--.

COLUMN 10

Line 32, "comprising" should read --comprises--.
    Line 33, "substrate" should read --substrate,--.
    Line 48, "substrate 305°" should read --substrate 305--.

UNITED STATES PATENT AND TRADEMARK OFFICE
CERTIFICATE OF CORRECTION

PATENT NO. : 5,016,565
DATED : May 21, 1991
INVENTOR(S) : KEISHI SAITOH, ET AL.

It is certified that error appears in the above-identified patent and that said Letters Patent is hereby corrected as shown below:

COLUMN 12

Line 2, "provide" should read --provides--.
Line 15, "of which" should be deleted.
Line 22, "of which" should be deleted.

Signed and Sealed this

Fifteenth Day of December, 1992

Attest:

DOUGLAS B. COMER

Attesting Officer

Acting Commissioner of Patents and Trademarks